United States Patent
Jiang et al.

(10) Patent No.: US 10,340,281 B2
(45) Date of Patent: Jul. 2, 2019

(54) THREE-DIMENSIONAL SEMICONDUCTOR DEVICE AND METHOD OF MANUFACTURING THE SAME

(71) Applicant: MACRONIX INTERNATIONAL CO., LTD., Hsinchu (TW)

(72) Inventors: Yu-Wei Jiang, Hsinchu (TW); Jia-Rong Chiou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 125 days.

(21) Appl. No.: 15/458,066

(22) Filed: Mar. 14, 2017

(65) Prior Publication Data
US 2018/0269214 A1 Sep. 20, 2018

(51) Int. Cl.
| | |
|---|---|
| H01L 27/11548 | (2017.01) |
| H01L 21/768 | (2006.01) |
| H01L 27/11556 | (2017.01) |
| H01L 27/11582 | (2017.01) |
| H01L 27/11575 | (2017.01) |

(52) U.S. Cl.
CPC .. *H01L 27/11548* (2013.01); *H01L 21/76805* (2013.01); *H01L 21/76816* (2013.01); *H01L 21/76889* (2013.01); *H01L 27/11556* (2013.01); *H01L 27/11575* (2013.01); *H01L 27/11582* (2013.01)

(58) Field of Classification Search
CPC ............. H01L 27/115; H01L 21/76889; H01L 21/76816; H01L 21/76805; H01L 27/11548; H01L 27/11575; H01L 27/11582; H01L 27/11556
See application file for complete search history.

(56) References Cited

U.S. PATENT DOCUMENTS

| | | | |
|---|---|---|---|
| 9,520,402 B1* | 12/2016 | Haller | H01L 23/528 |
| 2002/0081782 A1 | 6/2002 | Cleeves | |
| 2011/0063914 A1* | 3/2011 | Mikajiri | G11C 5/02 365/185.15 |
| 2012/0070944 A1* | 3/2012 | Kim | H01L 27/0688 438/128 |
| 2014/0162420 A1 | 6/2014 | Oh et al. | |
| 2015/0270165 A1 | 9/2015 | Hyun | |
| 2016/0099187 A1 | 4/2016 | Lian | |
| 2016/0268264 A1 | 9/2016 | Huwang et al. | |
| 2017/0200676 A1* | 7/2017 | Jeong | H01L 27/11524 |

* cited by examiner

*Primary Examiner* — Jay C Chang
*Assistant Examiner* — Mikka Liu
(74) *Attorney, Agent, or Firm* — McClure, Qualey & Rodack, LLP

(57) ABSTRACT

A three-dimensional (3D) semiconductor device is provided, comprising a substrate having an array area and a staircase area adjacent to the array area, wherein the staircase area comprises N steps, N is an integer one or greater; a stack having multi-layers on the substrate, and the multi-layers comprising active layers alternating with insulating layers on the substrate, the stack comprising sub-stacks formed on the substrate and the sub-stacks disposed in relation to the N steps of the staircase area to form respective contact regions, wherein an uppermost active layer of each of the sub-stacks in the respective contact regions comprises a silicide layer; and multilayered connectors, formed in the respective contact regions and extending downwardly to electrically connect the silicide layer in each of the sub-stacks.

20 Claims, 8 Drawing Sheets

THREE-DIMENSIONAL SEMICONDUCTOR DEVICE AND METHOD OF MANUFACTURING THE SAME

BACKGROUND

Field of the Invention

The disclosure relates in general to a three-dimensional (3D) semiconductor device and a method of manufacturing the same, more particularly to a 3D semiconductor device with silicide formation and a method of manufacturing the same.

Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed. Various semiconductor devices with three-dimensional (3D) stacked structures, having single-gate unit cells, double gate unit cells or surrounding gate unit cells, have been provided.

It is desirable to develop a semiconductor device with 3D stacked structure with larger number of multiple planes being stacked to achieve greater storage capacity, and with memory cells having excellent electrical properties (ex: reliability of data storage and speed of operation). Typically, a conventional 3D semiconductor device adopts an etching stopping layer (ex: SiN) deposited in the staircase area for covering the multi-layers of sub-stacks in the contact regions. Formation for all of the contact holes in the respective contact regions are synchronized by the etching stopping layer. Then, all of the contact holes break through the etching stopping layer and stop on the respective active layer (ex: polysilicon layers). However, the contact landing windows in the contact regions suffer from the existence of the etching stopping layer. If more OP layers are required for developing a 3D semiconductor device, the thicker etching stopping layer would be required, and the contact landing windows in the contact regions would be suffered even more due to formation of the etching stopping layer. Also, when the 3D semiconductor device is scaled down, it is known that the existence of the etching stopping layer would be the issue since it leave less space for the contact landing.

SUMMARY

The disclosure relates to a three-dimensional (3D) semiconductor device and a method of manufacturing the same. According to the embodiment, the contact landing windows of the 3D semiconductor device with silicide formation of the embodiment are significantly improved by silicide formation.

According to the present disclosure, a 3D semiconductor device is provided, comprising: a substrate having an array area and a staircase area adjacent to the array area, wherein the staircase area comprises N steps, N is an integer one or greater; a stack having multi-layers on the substrate, and the multi-layers comprising active layers alternating with insulating layers on the substrate, the stack comprising sub-stacks formed on the substrate and the sub-stacks disposed in relation to the N steps of the staircase area to form respective contact regions, wherein an uppermost active layer of each of the sub-stacks in the respective contact regions comprises a silicide layer; and multilayered connectors, formed in the respective contact regions and extending downwardly to electrically connect the silicide layer in each of the sub-stacks.

According to the present disclosure, a method of manufacturing a 3D semiconductor device is provided, comprising: providing a substrate having an array area and a staircase area adjacent to the array area, wherein the staircase area comprises N steps, N is an integer one or greater; forming a stack having multi-layers on the substrate, and the multi-layers comprising active layers alternating with insulating layers on the substrate, the stack comprising sub-stacks formed on the substrate and the sub-stacks disposed in relation to the N steps of the staircase area to form respective contact regions, wherein an uppermost active layer of each of the sub-stacks in the respective contact regions comprises a silicide layer; and; and forming multi-layered connectors in the respective contact regions and extending downwardly to electrically connect the silicide layer in each of the sub-stacks.

The disclosure will become apparent from the following detailed description of the preferred but non-limiting embodiments. The following description is made with reference to the accompanying drawings.

DETAILED DESCRIPTION

The embodiments of the present disclosure disclosed below are for elaborating a three-dimensional (3D) semiconductor device and a method of manufacturing the same. According to the embodiment, the contact landing windows of the 3D semiconductor device are significantly improved by silicide formation, no matter how many multilayers (ex: OP layers) stacked for the 3D semiconductor device or the 3D semiconductor device being scaled down. Thus, the 3D semiconductor device with silicide formation of the embodiment brings sufficient widths for contact landing windows for the structural configurations, thereby improving the electrical characteristics and performances of the 3D semiconductor device in application.

Figure 1:
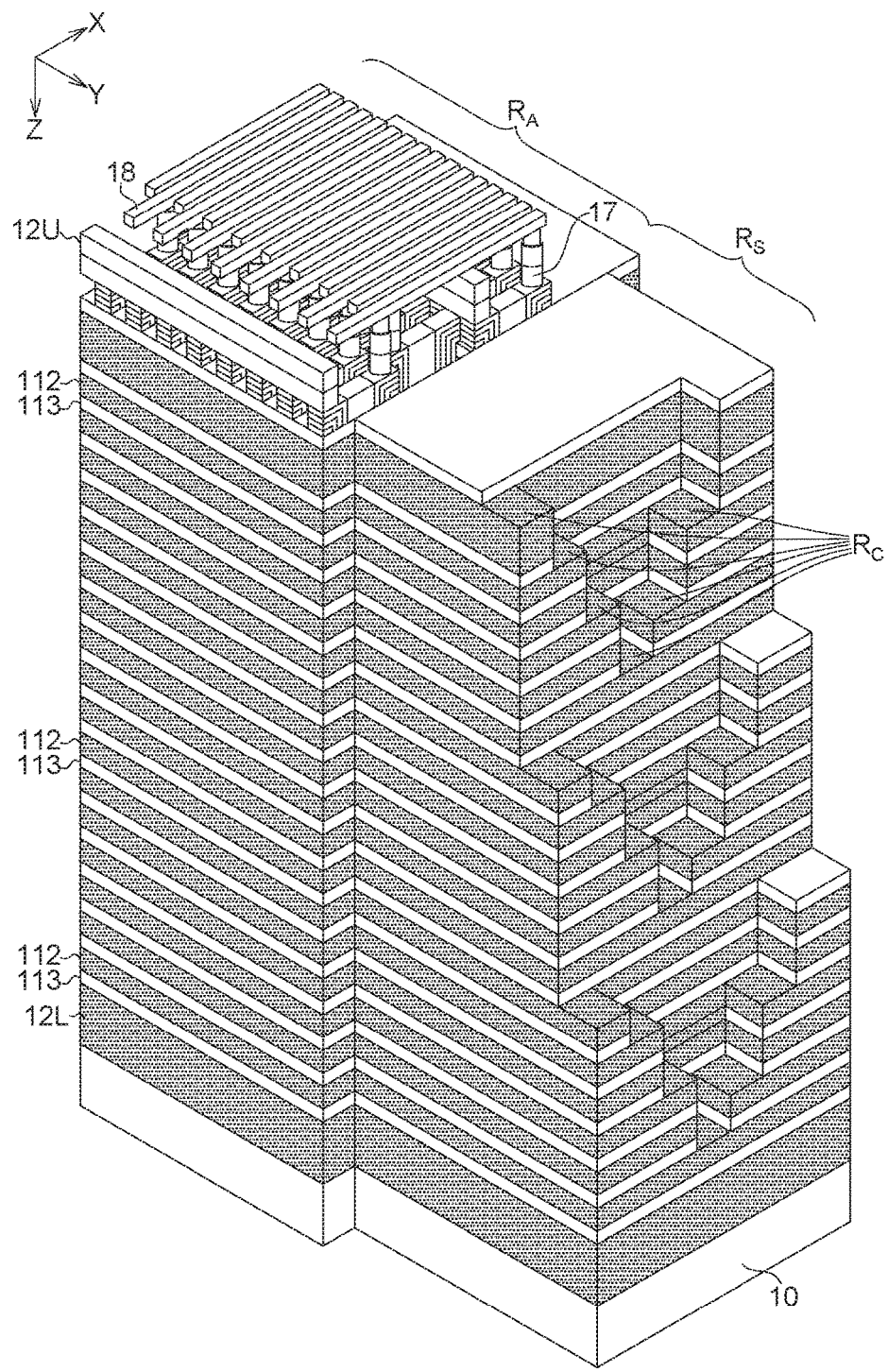
FIG. 1 simply shows a perspective view of a 3D semiconductor device.

The disclosure can be applied to various applications with different cell arrays of 3D semiconductor devices, such as vertical-channel (VC) 3D semiconductor devices and vertical-gate (VG) 3D semiconductor devices, and there are no particular limitations to the application types of 3D semiconductor devices. FIG. 1 simply shows a perspective view of a 3D semiconductor device. In FIG. 1, a VC 3D semiconductor device is illustrated for exemplification. A 3D semiconductor device comprises a stack having multi-layers on the substrate 10, and the substrate 10 has an array area $R_A$ and a staircase area $R_S$ adjacent to the array area $R_A$, wherein the staircase area $R_S$ comprises N steps, N is an integer one or greater. The multi-layers comprises a plurality of active layers 112 (i.e. the memory layers; such as comprising control gates in the VC device) alternating with plural insulating layers 113 on the substrate 10. Typically, the 3D semiconductor device further comprises a plurality of upper selection lines 12U (ex: the upper selection lines could be common source lines) disposed on the active layers 112 (i.e. memory layers) and parallel to each other; a plurality of strings (not shown) formed vertically to the active layers 112 and the upper selection lines 12U, wherein the strings are electrically connected to the corresponding upper selection lines 12U. Also, the 3D semiconductor device comprises a plurality of conductors 18 (such as bit lines BLs) disposed on the upper selection lines 12U, and the conductors 18 are arranged in parallel to each other and in perpendicular to the upper selection lines 12U. A plurality of cells, respectively defined by the strings, the upper selection lines 12U and the conductors 18 correspondingly, are arranged in a plurality of rows and columns to form a memory array in the array area $R_A$. Also, a plurality of string contacts 17 are formed vertically to the active layers 112 and the upper selection lines 12U, and each of the string contacts 17 is disposed correspondingly at each of the strings of the cells, wherein the string contacts 17 are electrically connected to the corresponding upper selection lines 12U and the corresponding conductors 18. The 3D semiconductor device may comprise other known elements; for example, the lower select lines 12L (ex: functioning as inversion gates (IG)) are further formed under the memory layers.

Also, the stack of the embodiment comprises a plurality of sub-stacks formed on the substrate 10, and the sub-stacks are disposed in relation to the N steps of the staircase area $R_S$ to form respective contact regions $R_C$. In the staircase area $R_S$, the embodied 3D semiconductor device further comprises a plurality of multilayered connectors (not shown in FIG. 1, but in FIG. 2) formed in the respective contact regions $R_C$. According to the embodiment, an uppermost active layer of each of the sub-stacks in the respective contact regions $R_C$ comprises a silicide layer for covering the landing area (ex: a contact pad, such as the word line pad), and the multilayered connectors extend downwardly to electrically connect (ex: directly contact) the silicide layer in each of the sub-stacks. In one embodiment, the active layers of the sub-stacks in the respective contact regions $R_C$ of the staircase area $R_S$ are extended from the active layers (ex: polysilicon layers functioning as word lines) in the array area $R_A$. One of the 3D semiconductor devices of the embodiment with silicide formation in the staircase area $R_S$ is exemplified below; but the details are provided for illustrating, not for limiting, the embodiments of the disclosure.

Embodiments are provided hereinafter with reference to the accompanying drawings for describing the related configurations and procedures. Related structural details such as layers and spatial arrangement are further described in the embodiments. However, the present disclosure is not limited to those illustrated in the drawings. It is noted that not all embodiments of the invention and the applications are shown. There may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 2:
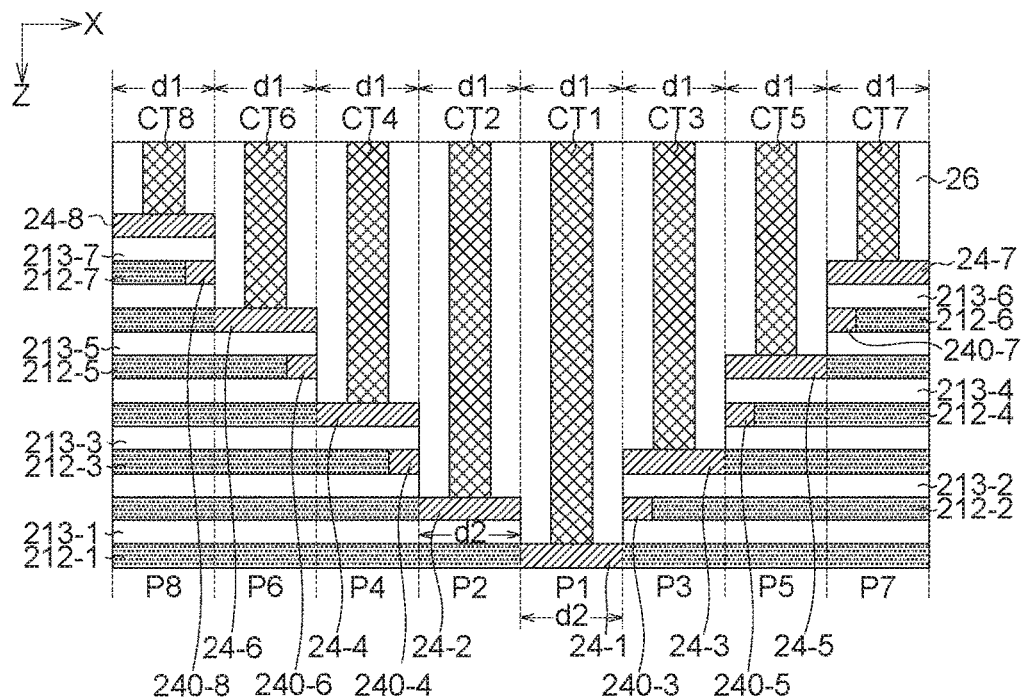
FIG. 2 is a cross-sectional view of a staircase area of a 3D semiconductor device according to one embodiment of the present disclosure.

FIG. 2 is a cross-sectional view of a staircase area of a 3D semiconductor device according to one embodiment of the present disclosure. FIG. 3A-FIG. 3L illustrate a method for manufacturing a 3D semiconductor device with silicide formation in the staircase area according to one embodiment of the present disclosure. In FIG. 2 and FIG. 3A-FIG. 3L, eight pairs of active layers and insulating layers and eight contact regions (P1-P8; N=8) are exemplified for illustration. It is of course that the numbers of the contact regions and the pairs of active layers and the insulating layers can be changed depending on the requirements of practical application. Also, for the purpose of clear illustration, it is noted that the layers (ex: an oxide later, the selection layer and the substrate) under the pairs of active layers and insulating layers in FIG. 2 and FIG. 3A-FIG. 3L have been omitted for simplifying the drawings.

As shown in FIG. 2, the stack of the embodiment comprises several sub-stacks formed on the substrate, and the sub-stacks are disposed in respective contact regions P1, P2, P3, P4, P5, P6, P7 and P8 at the staircase area ($R_S$ of FIG. 1; 8 steps (N=8)). The active layers (such as 212-1, 212-2, 212-3, 212-4, 212-5, 212-6, 212-7) alternating with the insulating layers (such as 213-1, 213-2, 213-3, 213-4, 213-5, 213-6, 213-7) in the staircase area of the embodied 3D semiconductor device are depicted in FIG. 2. The embodied 3D semiconductor device further comprises the multilayered connectors CT1, CT2, CT3, CT4, CT5, CT6, CT7 and CT8 formed in the respective contact regions P1-P8 of the staircase area. Also, according to the embodiment, an uppermost active layer of each of the sub-stacks in the respective contact regions comprises a silicide layer; for example, the silicide layers 24-1, 24-2, 24-3, 24-4, 24-5, 24-6, 24-7 and 24-8 formed in the contact regions P1, P2, P3, P4, P5, P6, P7 and P8, respectively. In one embodiment, the other active layers beneath the silicide layers of each of the sub-stacks in the respective contact regions could be polysilicon layers. The multilayered connectors CT1, CT2, CT3, CT4, CT5, CT6, CT7 and CT8 extend downwardly to electrically connect (ex: directly contact) the silicide layers 24-1, 24-2, 24-3, 24-4, 24-5, 24-6, 24-7 and 24-8 in the sub-stacks correspondingly.

Figure 4:
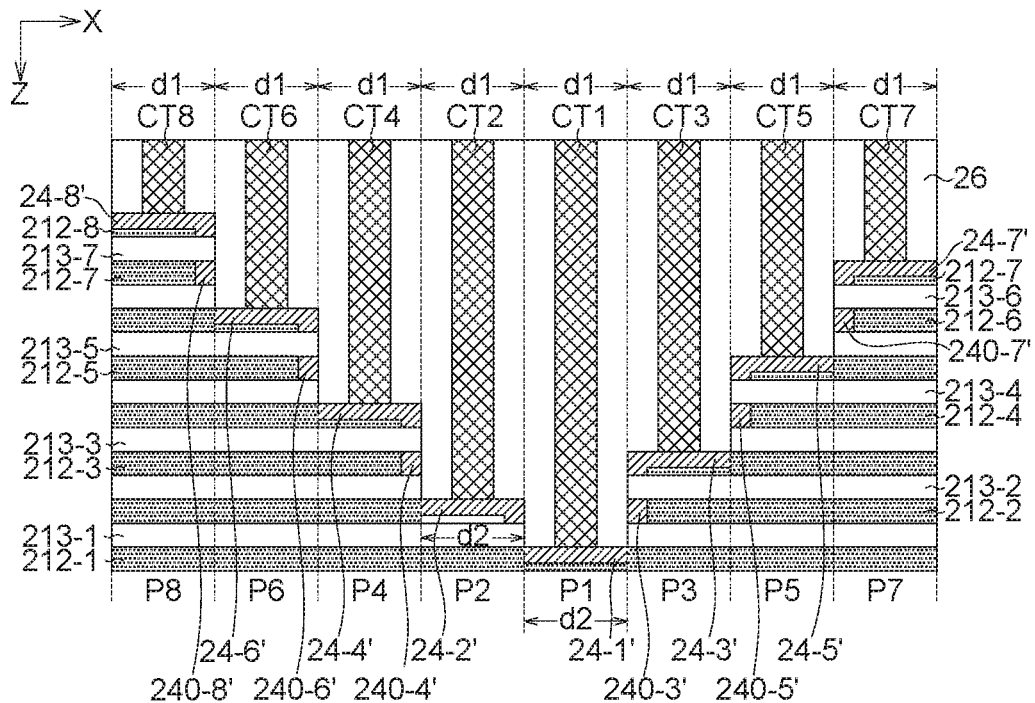
FIG. 4 is a cross-sectional view of a staircase area of another 3D semiconductor device according to one embodiment of the present disclosure.

It is noted that FIG. 2 depicts one of the embodiments that each of the uppermost active layers (such as 24-1, 24-2, 24-3, 24-4, 24-5, 24-6, 24-7 and 24-8) of the sub-stacks is the silicide layer itself, wherein the silicide layers can be formed by fully transforming an uppermost polysilicon layer of each of the sub-stacks into silicide during manufacture. However, the disclosure is not limited thereto, in some embodiments, the uppermost active layer of each of the sub-stacks may comprise a polysilicon layer and a silicide layer formed on the polysilicon layer (ex: by partially transforming an uppermost polysilicon layer of each sub-stack, and the structural details as shown in FIG. 4 are described later).

Also, the 3D semiconductor device further comprises a dielectric layer 26 (such as inter-layered dielectric (ILD)) formed on the sub-stacks in the respective contact regions (ex: P1-P8). The multilayered connectors (ex: CT1, CT2, CT3, CT4, CT5, CT6, CT7 and CT8) extend downwardly in the dielectric layer 26, wherein the dielectric layer 26 directly contacts the silicide layers 24-1, 24-2, 24-3, 24-4, 24-5, 24-6, 24-7 and 24-8 of the sub-stacks. As shown in FIG. 2, the silicide layers 24-1, 24-2, 24-3, 24-4, 24-5, 24-6, 24-7 and 24-8 of the sub-stacks in the respective contact regions P1-P8 function as landing areas of the sub-stacks, and all of the landing areas (i.e. the top surfaces of the silicide layers) other than parts contacted by the multilayered connectors CT1-CT8 are directly covered by the dielectric layer 26.

Additionally, in a 3D semiconductor device according to one embodiment, lateral ends of the active layers 212 of the sub-stacks in the respective contact regions (ex: P1-P8) may comprise silicide portions. For example, the silicide portions 240-3, 240-4, 240-5, 240-6, 240-7 and 240-8 are respectively formed in the contact regions P3-P8, as shown in FIG. 2. Also, the silicide portions 240-3, 240-4, 240-5, 240-6, 240-7 and 240-8 of the active layers directly contact the dielectric layer 26. According to the embodiment, the silicide layers 24-1, 24-2, 24-3, 24-4, 24-5, 24-6, 24-7 and 24-8 and the silicide portions 240-3, 240-4, 240-5, 240-6, 240-7 and 240-8 comprise the same material.

FIG. 3A-FIG. 3L illustrate a method for manufacturing the 3D semiconductor device of FIG. 2 with silicide formation in the staircase area. FIG. 3A-FIG. 3F illustrates one of application procedures to form the staircase area comprising N steps (N=8 in figures). Noted that steps in FIG. 3A-FIG. 3F are merely provided for illustration, other lithography methods can be also applied for making the related sub-stacks in the N steps staircase area.

Figure 3A:
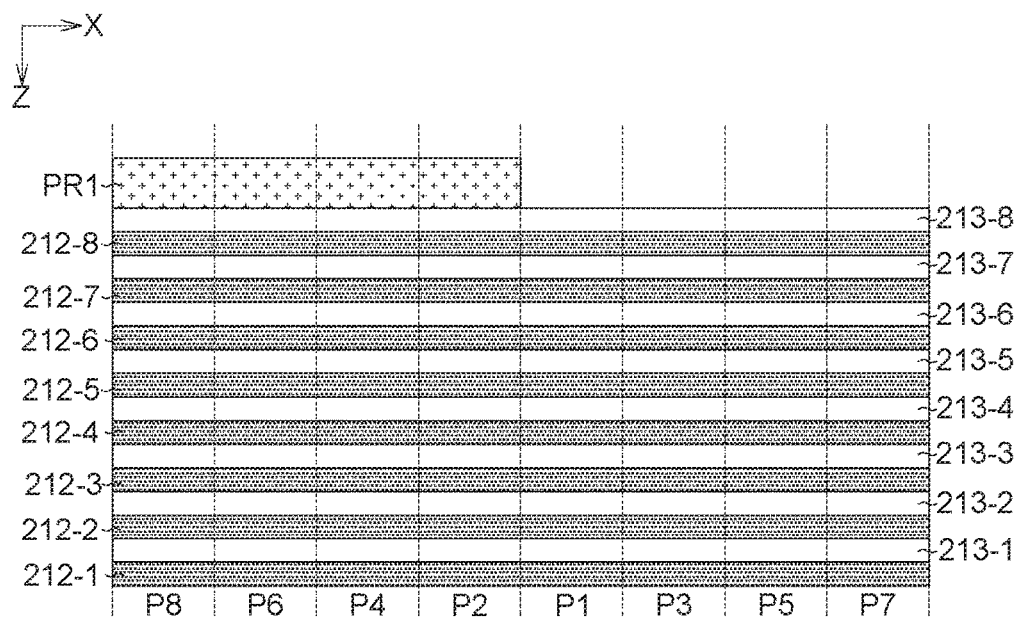
FIG. 3A-FIG. 3L illustrate a method for manufacturing a 3D semiconductor device silicide formation in the staircase area according to one embodiment of the present disclosure.
Figure 3B:
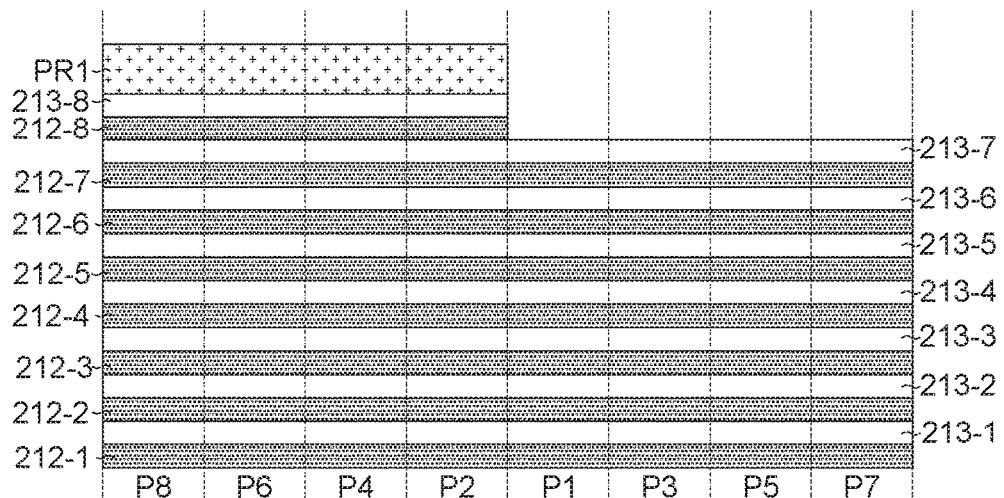

As shown in FIG. 3A, the multi-layers comprising the active layers (such as 212-1, 212-2, 212-3, 212-4, 212-5, 212-6, 212-7 and 212-8) alternating with the insulating layers (such as 213-1, 213-2, 213-3, 213-4, 213-5, 213-6, 213-7 and 213-8) formed on the substrate (not shown) are provided (for example, eight pairs of the polysilicon layers and the oxide layers; also known as OP pairs), and a first patterned photo-resist layer PR1 is disposed on the multi-layers related to the contact regions P8, P6, P4 and P2. Then, the active layer 212-8 and the insulating layers 213-8 are patterned by the first patterned photo-resist layer PR1, so as to remove the active layer 212-8 and the insulating layers 213-8 related to the contact regions P1, P3, P5 and P7, as shown in FIG. 3B. Afterward, the first patterned photo-resist layer PR1 is removed.

Figure 3C:
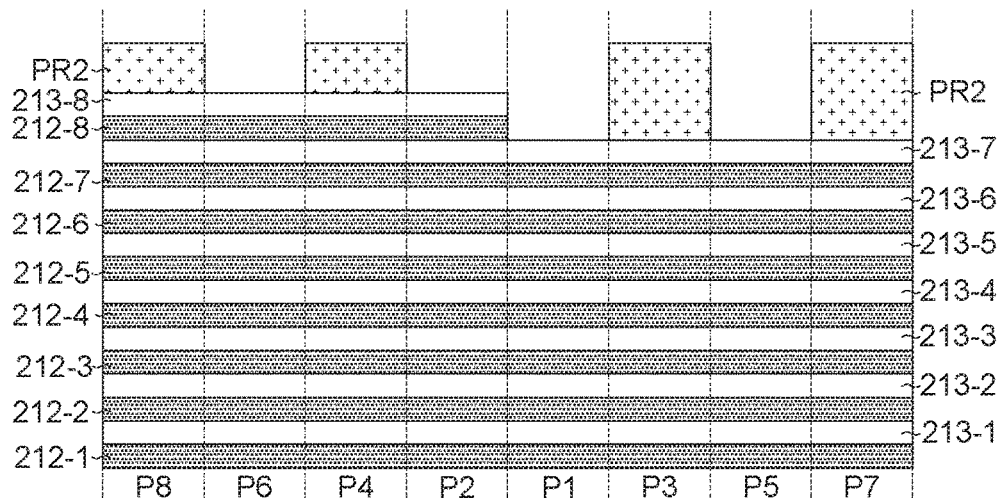
Figure 3D:
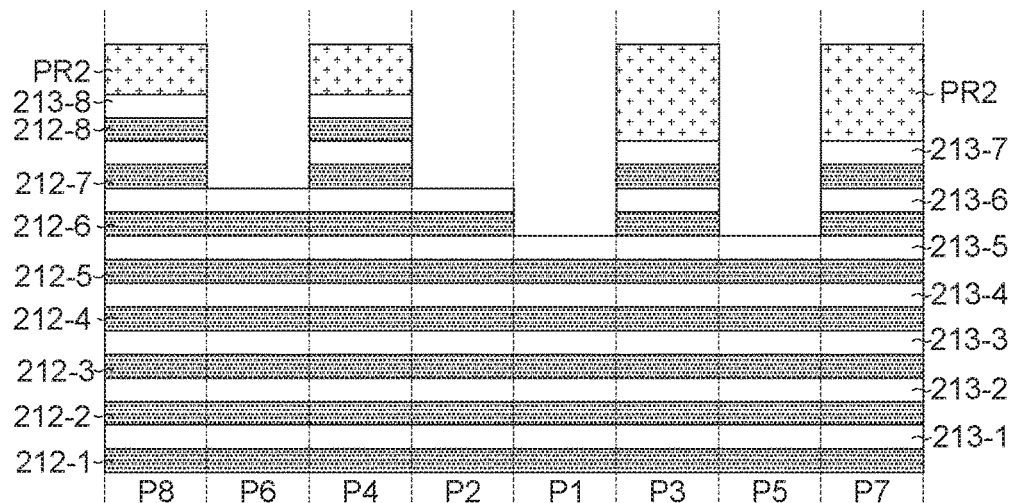

As shown in FIG. 3C, a second patterned photo-resist layer PR2 is disposed on the multi-layers related to the contact regions P8, P4, P3 and P7. Then, the multi-layers of FIG. 3C are patterned according to the second patterned photo-resist layer PR2 for removing two pairs of the active layers and the insulating layers related to the contact regions P6, P2, P1 and P5, as shown in FIG. 3D. Afterward, the second patterned photo-resist layer PR2 is removed.

Figure 3E:
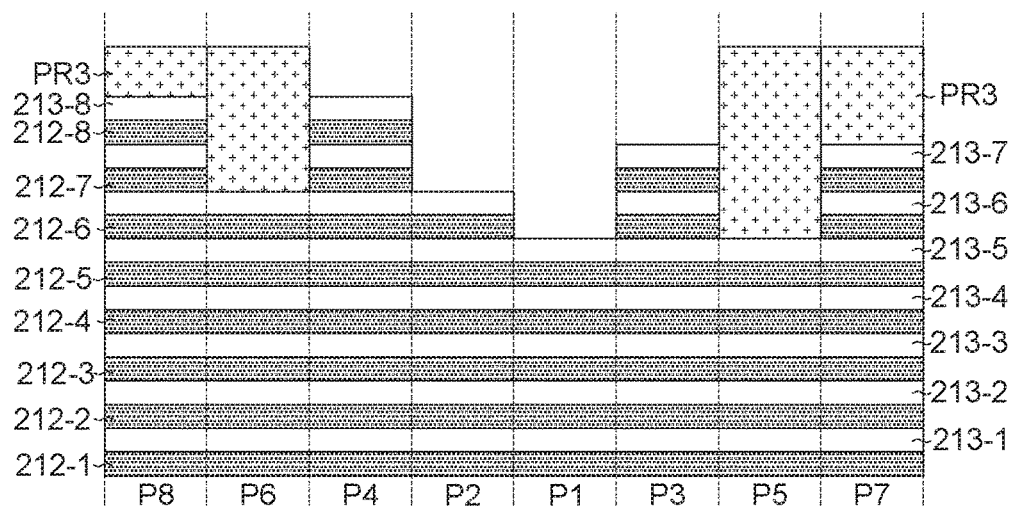
Figure 3F:
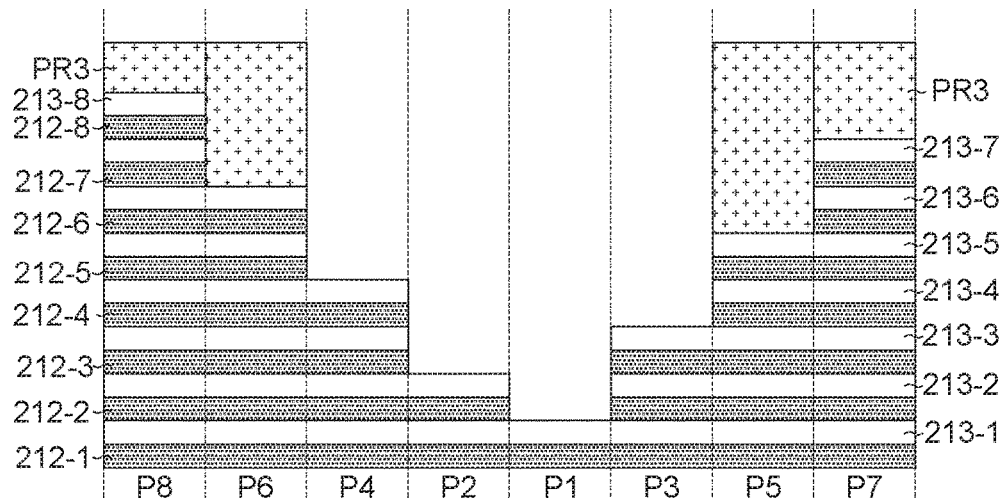

As shown in FIG. 3E, a third patterned photo-resist layer PR3 is disposed on the multi-layers related to the contact regions P8, P6, P5 and P7. Then, the multi-layers of FIG. 3E are patterned according to the third patterned photo-resist layer PR3 for removing four pairs of the active layers and the insulating layers related to the contact regions P4, P2, P1 and P3, as shown in FIG. 3F. Afterward, the third patterned photo-resist layer PR3 is removed. Accordingly, the sub-stacks in relation to the N (N=8) steps of the staircase area are generated in the respective contact regions P1-P8.

Figure 3G:
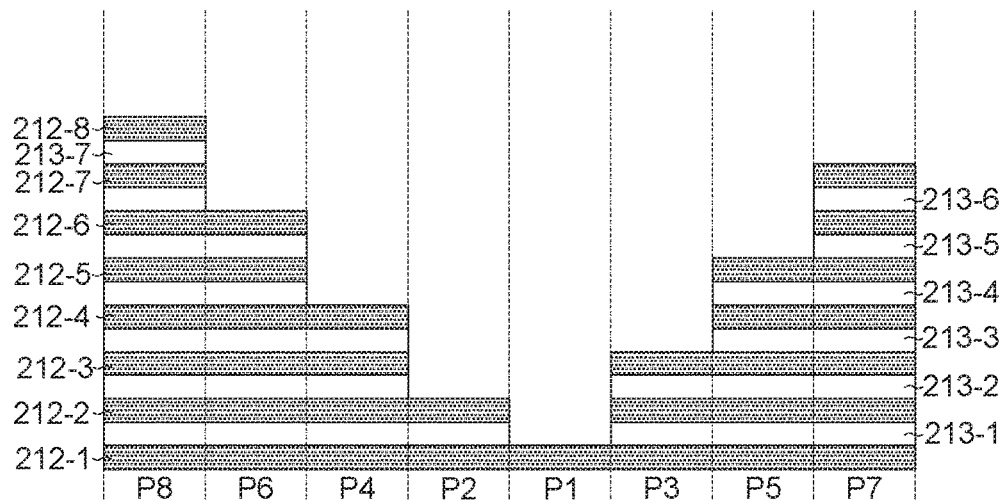

As shown in FIG. 3G, the uppermost insulating layers (ex: oxide layers) of the sub-stacks in the respective contact regions P1-P8 are completely removed, such as by oxide etching. That is, the uppermost insulating layers 213-8, 213-6, 213-4, 213-2, 213-1, 213-3, 213-5, 213-7 respectively in the contact regions P8, P6, P4, P2, P1, P3, P5 and P7 (FIG. 3F) are completely removed to expose the uppermost active layers.

Figure 3H:
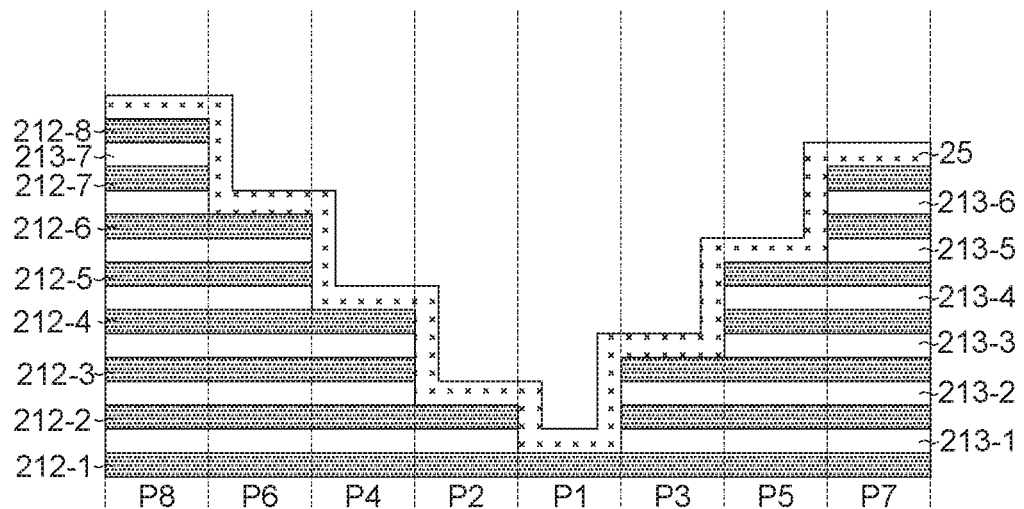

As shown in FIG. 3H, a metal layer 25 is disposed on an uppermost active (ex: polysilicon) layer of each of the sub-stacks in the respective contact regions P1-P8, and the metal layer 25 is also deposited on exposed sidewalls of the sub-stacks. Therefore, the metal layer 25 is deposited as a blanket covering the sub-stacks in the contact regions P1-P8 of FIG. 3H. In one embodiment, the metal layer 25 may comprise cobalt (Co), nickel (Ni), or titanium (Ti), or other suitable metal materials.

Figure 3I:
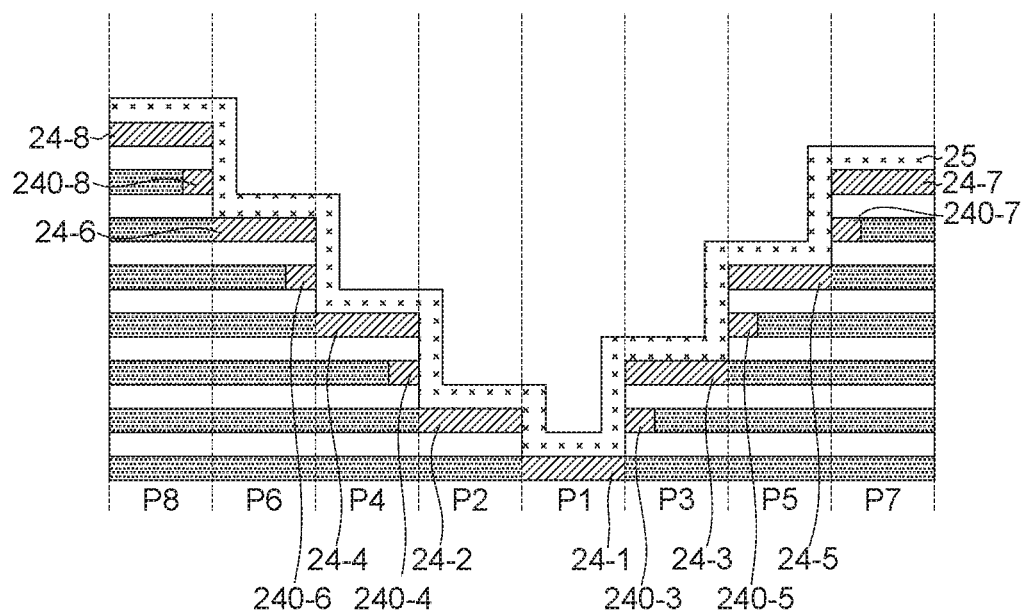

Afterward, as shown in FIG. 3I, the structure is thermally annealed to form the silicide layers 24-1, 24-2, 24-3, 24-4, 24-5, 24-6, 24-7 and 24-8 of the sub-stacks in the respective contact regions P1-P8; such as at a high temperature in a range of 600° C. to 1000° C. Since the metal layer 25 is also deposited on exposed sidewalls of the sub-stacks, each of lateral ends of the active layers (ex: 212-2, 212-3, 212-4, 212-5, 212-6 and 212-7) related to the exposed sidewalls of the sub-stacks comprises a silicide portion (ex: 240-3, 240-4, 240-5, 240-6, 240-7, 240-8) after thermally annealing.

In one embodiment, the silicide layers comprise at least one of cobalt silicide, nickel silicide, titanium silicide, molybdenum disilicide and tungsten silicide. For example, the silicide layers may comprise CoSi, CoSi$_2$ or the mixture/combination thereof. In another embodiment, the silicide layers may comprise TiSi, TiSi2 or the mixture/combination thereof. In other embodiment, the silicide layers may comprise NiSi, NiSix or the mixture/combination. In other embodiment, materials such as molybdenum disilicide (MoSi$_2$) and tungsten silicide (WSi$_2$) are also applicable as materials of the silicide layers. Materials of the silicide layers depend on the thermal conditions conducted in the application, and the disclosure is not limited to those listed materials above. It has highly etching selectivity for oxide to silicide.

Figure 3J:
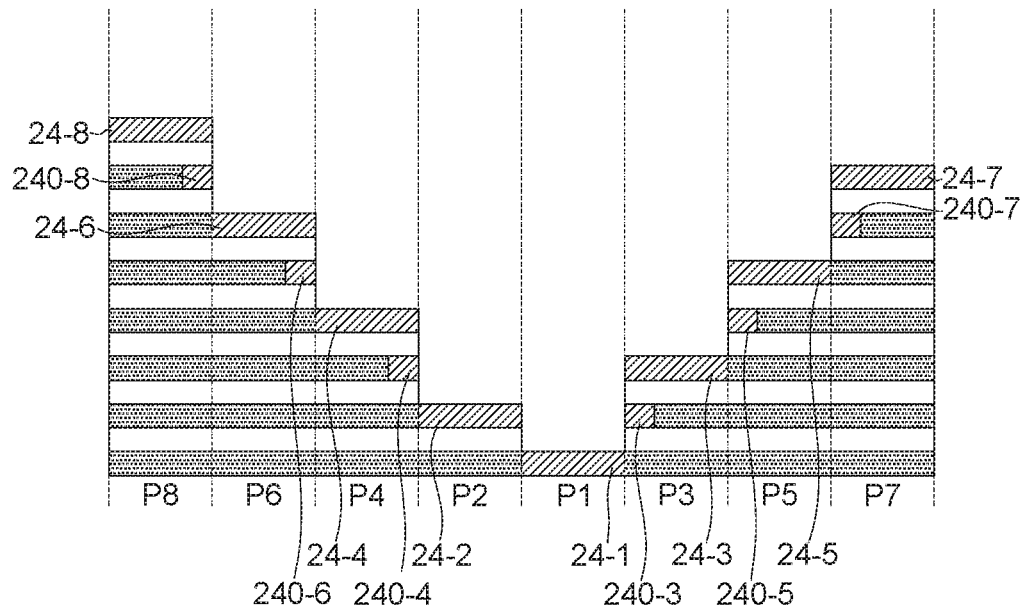

As shown in FIG. 3J, the unreacted portions of the metal layer 25 (ex: non-CoSi material portions) are removed to reveal the silicide layers 24-1, 24-2, 24-3, 24-4, 24-5, 24-6, 24-7 and 24-8, and the silicide portions 240-3, 240-4, 240-5, 240-6, 240-7 and 240-8 of the sub-stacks.

Figure 3K:
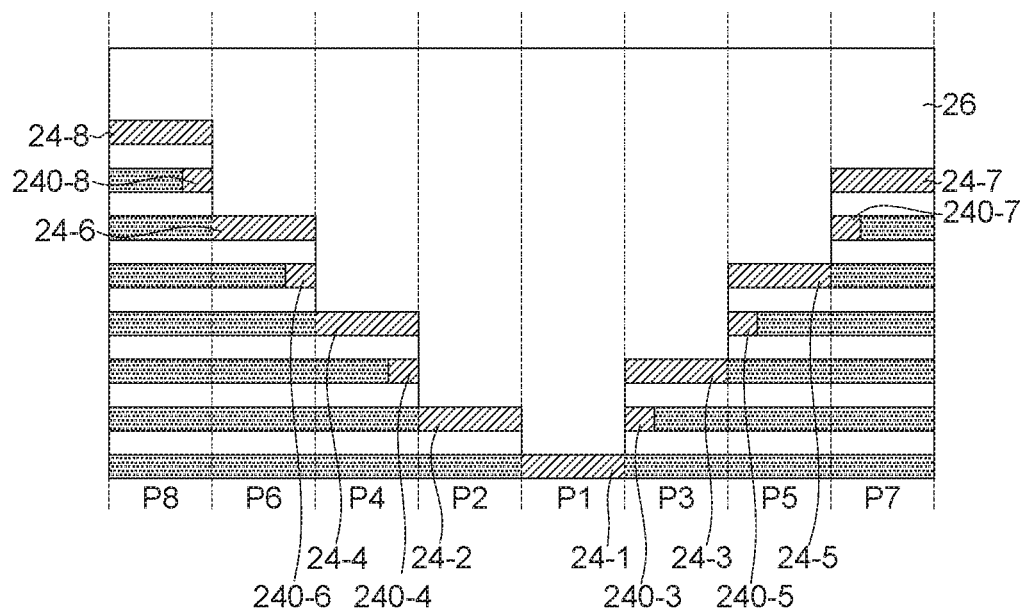

Next, an insulation such as inter-layered dielectric (ILD) is deposited above the sub-stacks, followed by chemical-mechanical polishing (CMP) to form the dielectric layer 26, as shown in FIG. 3K. The dielectric layer 26 directly contacts the silicide layers 24-1, 24-2, 24-3, 24-4, 24-5, 24-6, 24-7 and 24-8 and the silicide portions 240-3, 240-4, 240-5, 240-6, 240-7 and 240-8 of the sub-stacks.

Figure 3L:
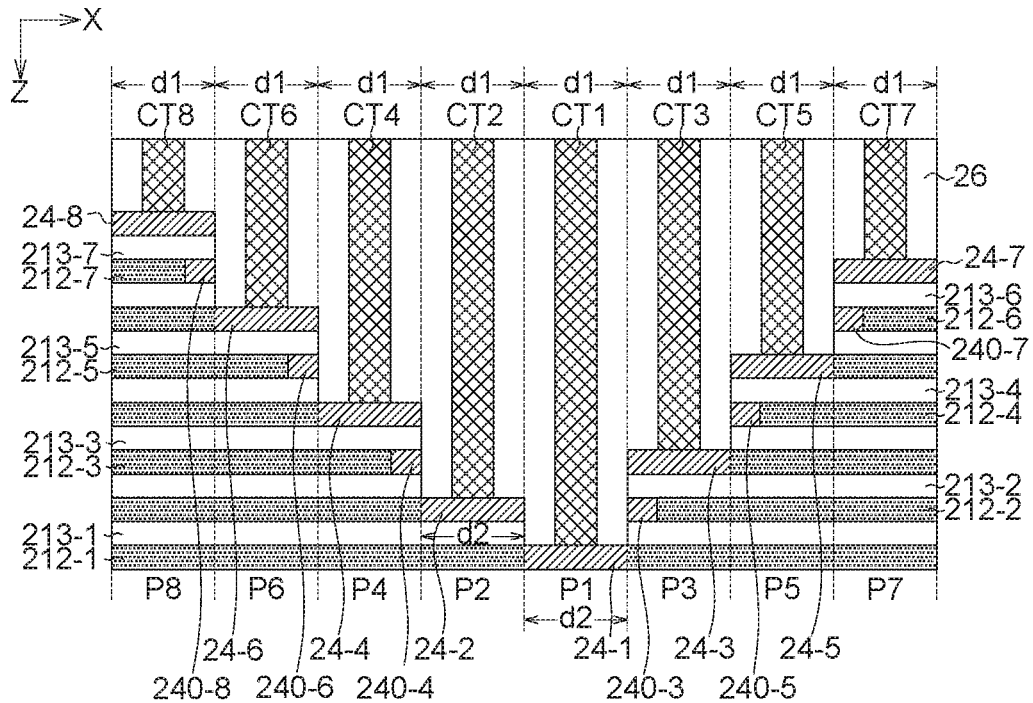

As shown in FIG. 3L, plural multilayered connectors CT1, CT2, CT3, CT4, CT5, CT6, CT7 and CT8 are formed to extend downwardly in the dielectric layer 26 for directly contacting the silicide layers 24-1, 24-2, 24-3, 24-4, 24-5, 24-6, 24-7 and 24-8 in the respective contact regions P1-P8. As shown in FIG. 3L/FIG. 2, in one embodiment, each of landing area of the sub-stacks has a first width d1 along the first direction (ex: x-direction), and each of the silicide layers 24-1, 24-2, 24-3, 24-4, 24-5, 24-6, 24-7 and 24-8 of the sub-stacks in the respective contact regions P1-P8 has a second width d2 along the first direction (ex: x-direction), wherein the first width d1 is substantially equal to the second width d2. According to the 3D semiconductor device of the embodiment, since the silicide layers of the sub-stacks in the respective contact regions function as the landing areas of the sub-stacks, the contact landing windows would be released compared to the conventional 3D semiconductor device, especially for the contact landing window of the contact region P1 with only one active layer.

FIG. 4 is a cross-sectional view of a staircase area of another 3D semiconductor device according to one embodiment of the present disclosure. It is noted that FIG. 2 and FIG. 3I-FIG. 3L depict one of the embodiments that each of the uppermost active layers (such as 212-1, 212-2, 212-3, 212-4, 212-5, 212-6, 212-7 and 212-8) of the sub-stacks is the silicide layer itself, wherein the silicide layers can be formed by fully transforming an uppermost polysilicon layer of each of the sub-stacks into silicide during thermal annealing (ex: the step in FIG. 3I). However, the disclosure is not limited thereto. FIG. 4 shows that the uppermost active layer of each of the sub-stacks may comprise a polysilicon layer (ex: 212-8/212-7/212-6/212-5/212-4/212-3/212-2/212-1) and a silicide layer (ex: 24-1'/24-2'/24-3'/24-4'/24-5'/24-6'/24-7'/24-8') formed on the polysilicon layer in some embodiments. As shown in FIG. 4, the silicide layers 24-1', 24-2', 24-3', 24-4', 24-5', 24-6', 24-7' and 24-8' are formed by partially transforming the uppermost polysilicon layers of the sub-stacks into silicide, and the unreacted polysilicon remained under the silicide layers. Also, the silicide portions 240-3', 240-4', 240-5', 240-6', 240-7' and 240-8' of the sub-stacks are also formed in the configuration (as illustrated in the above embodiment; FIG. 2-FIG. 3G). In one but not limited example, the uppermost polysilicon layer has a thickness of about 300 Å before thermal annealing; after thermal annealing, the thickness of one of the silicide layers 24-1', 24-2', 24-3', 24-4', 24-5', 24-6', 24-7' and 24-8' could be about 200 Å, and the thickness of one of the unreacted polysilicon layers remained under the silicide layers could be about 100 Å. It is noted that the uppermost polysilicon layer of each sub-stack is fully transformed or partially transformed is controllable by adjusting thermal-annealing conditions, and determined according to actual requirements of practical application.

According to the aforementioned descriptions, the 3D semiconductor device with improved contact landing window by silicide formation and method of manufacturing the same are provided. According to the embodiment, the uppermost active layers in the contact regions P1-P8 comprising silicide. For example, the exposed active layers such as the exposed polysilicon layers are utilized for forming silicide layers by thermal annealing. According to the embodiment, the silicide layers of the sub-stacks in the respective contact regions of the 3D semiconductor device of the embodiment function as the landing areas with the same width (d1) for the landing of the multilayered connectors, and the contact landing windows are greatly improved compared to the conventional 3D semiconductor device (adopting SiN as a stopping layer to synchronize the formation for all of the contacts). Additionally, with the increasing numbers of the OP layers for developing a 3D semiconductor device, the etching stopping layer (ex: SiN) adopted in the conventional 3D semiconductor device would be thicker and thicker, and the contact landing windows in the contact regions would be suffered even more due to formation of the etching stopping layer (ex: SiN), especially for the contact landing window of the contact region P1 with only one active layer. According to the 3D semiconductor device of the embodiment, there is no etching stopping layer adopted to synchronize the formation for all of the contacts, and the contact landing window of every contact region would have sufficient widths (ex: d1 or d2 in FIG. 2/FIG. 3L/FIG. 4) no matter how many OP layers stacked for the 3D semiconductor device or the 3D semiconductor device being scaled down.

Other embodiments with different configurations of known elements in the device/apparatus can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:
   a substrate having an array area and a staircase area adjacent to the array area, wherein the staircase area comprises N steps, N is an integer one or greater;
   a stack having multi-layers on the substrate, and the multi-layers comprising active layers alternating with insulating layers above the substrate, the stack comprising sub-stacks formed on the substrate and the sub-stacks disposed in relation to the N steps of the staircase area to form respective contact regions, wherein two of the respective contact regions are positioned higher than one of the respective contact regions disposed between said two of the respective contact regions, and an uppermost active layer of each of the sub-stacks in the respective contact regions comprises a silicide layer, wherein the uppermost active layer of each of the sub-stacks in the respective contact regions is continuously extended from one of the active layers in the array area respectively; and
   multilayered connectors, formed in the respective contact regions and extending downwardly to electrically connect the silicide layer of the uppermost active layer in each of the sub-stacks.

2. The 3D semiconductor device according to claim 1, wherein the uppermost active layer of each of the sub-stacks is the silicide layer itself.

3. The 3D semiconductor device according to claim 1, wherein the uppermost active layer of each of the sub-stacks comprises a polysilicon layer and the silicide layer formed on the polysilicon layer.

4. The 3D semiconductor device according to claim 1, further comprising a dielectric layer formed on the sub-stacks in the respective contact regions, and the multilayered connectors extending downwardly in the dielectric layer, wherein the dielectric layer directly contacts the silicide layer in each of the sub-stacks.

5. The 3D semiconductor device according to claim 4, wherein the silicide layers of the sub-stacks in the respective contact regions function as landing areas of the sub-stacks, and all of the landing areas other than parts contacted by the multilayered connectors are directly covered by the dielectric layer.

6. The 3D semiconductor device according to claim 1, wherein lateral ends of the active layers of the sub-stacks in the respective contact regions comprise silicide portions.

7. The 3D semiconductor device according to claim 6, wherein the silicide portions of the active layers directly contact a dielectric layer formed on the sub-stacks in the respective contact regions, wherein the multilayered connectors extend downwardly in the dielectric layer.

8. The 3D semiconductor device according to claim 1, wherein a landing area of each of the sub-stacks has a first width along a first direction, and the silicide layer of each of the sub-stacks in the respective contact regions has a second width along the first direction, wherein the first width is equal to the second width.

9. The 3D semiconductor device according to claim 1, wherein the silicide layer comprises one of cobalt silicide, nickel silicide, titanium silicide, molybdenum disilicide and tungsten silicide.

10. A method of manufacturing a three-dimensional (3D) semiconductor device, comprising:

providing a substrate having an array area and a staircase area adjacent to the array area, wherein the staircase area comprises N steps, N is an integer one or greater;

forming a stack having multi-layers on the substrate, and the multi-layers comprising active layers alternating with insulating layers on the substrate, the stack comprising sub-stacks formed on the substrate and the sub-stacks disposed in relation to the N steps of the staircase area to form respective contact regions, wherein two of the respective contact regions are positioned higher than one of the respective contact regions disposed between said two of the respective contact regions, and an uppermost active layer of each of the sub-stacks in the respective contact regions comprises a silicide layer, wherein the uppermost active layer of each of the sub-stacks in the respective contact regions is continuously extended from one of the active layers in the array area respectively; and forming multilayered connectors in the respective contact regions and extending downwardly to electrically connect the silicide layer of the uppermost active layer in each of the sub-stacks.

11. The method according to claim 10, wherein the uppermost active layer of each of the sub-stacks is the silicide layer itself.

12. The method according to claim 10, wherein the uppermost active layer of each of the sub-stacks is partially transformed to the silicide layer, so that the uppermost active layer of each of the sub-stacks comprises a polysilicon layer and the silicide layer formed on the polysilicon layer.

13. The method according to claim 10, further comprising forming a dielectric layer on the sub-stacks in the respective contact regions, wherein the multilayered connectors extend downwardly in the dielectric layer, and the dielectric layer directly contacts the silicide layer in each of the sub-stacks.

14. The method according to claim 13, wherein the silicide layers of the sub-stacks in the respective contact regions function as landing areas of the sub-stacks, and all of the landing areas other than parts contacted by the multilayered connectors are directly covered by the dielectric layer.

15. The method according to claim 10, wherein lateral ends of the active layers of the sub-stacks in the respective contact regions comprise silicide portions.

16. The method according to claim 15, wherein the silicide portions of the active layers directly contact a dielectric layer formed on the sub-stacks in the respective contact regions, wherein the multilayered connectors extend downwardly in the dielectric layer.

17. The method according to claim 16, wherein forming the silicide layer of each of the sub-stacks comprises:

forming the sub-stacks comprising polysilicon layers as the active layers alternating with the insulating layers on the substrate in the respective contact regions;

removing an uppermost insulating layer of each of the sub-stacks in the respective contact regions;

disposing a metal layer on an uppermost polysilicon layer of each of the sub-stacks in the respective contact regions; and thermally annealing the sub-stacks and the metal layer to form the silicide layer of each of the sub-stacks in the respective contact regions.

18. The method according to claim 17, wherein the metal layer is also deposited on exposed sidewalls of the sub-stacks, each of the lateral ends of the active layers related to the exposed sidewalls of the sub-stacks comprises the silicide portion after thermal annealing.

19. The method according to claim 10, wherein a landing area of each of the sub-stacks has a first width along a first direction, and the silicide layer of each of the sub-stacks in the respective contact regions has a second width along the first direction, wherein the first width is equal to the second width.

20. The method according to claim 10, wherein the silicide layer of each of the sub-stacks in the respective contact regions comprises one of cobalt silicide, nickel silicide, titanium silicide, molybdenum disilicide and tungsten silicide.

* * * * *